United States Patent
Schulman et al.

(10) Patent No.: US 7,700,969 B1
(45) Date of Patent: Apr. 20, 2010

(54) TYPE II INTERBAND HETEROSTRUCTURE BACKWARD DIODES

(75) Inventors: Joel N. Schulman, Malibu, CA (US); David H. Chow, Newbury Park, CA (US); Chanh Nguyen, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 237 days.

(21) Appl. No.: 11/700,442

(22) Filed: Jan. 30, 2007

(51) Int. Cl.
*H01L 29/74* (2006.01)
*H01L 29/80* (2006.01)
*H01S 3/00* (2006.01)

(52) U.S. Cl. .................. 257/104; 257/183; 257/189; 257/191; 372/145

(58) Field of Classification Search ............. 257/104, 257/183, 185, 189, 191; 372/45
See application file for complete search history.

(56) References Cited

U.S. PATENT DOCUMENTS

| | | | |
|---|---|---|---|
| 4,198,644 A | 4/1980 | Esaki et al. | |
| 4,371,884 A | 2/1983 | Esaki et al. | |
| 5,021,863 A * | 6/1991 | Yokoyama et al. | 257/585 |
| 5,113,231 A * | 5/1992 | Soderstrom et al. | 257/25 |
| 5,338,394 A | 8/1994 | Fathimulla et al. | |
| 5,414,274 A * | 5/1995 | Goronkin et al. | 257/25 |
| 5,588,015 A | 12/1996 | Yang | |
| 6,054,729 A | 4/2000 | Berenz | |
| 6,384,432 B1 * | 5/2002 | Berenz | 257/192 |
| 6,448,582 B1 * | 9/2002 | Woodall et al. | 257/79 |
| 6,607,932 B2 * | 8/2003 | Woodall et al. | 438/22 |
| 6,635,907 B1 * | 10/2003 | Nguyen et al. | 257/183 |
| 6,785,313 B2 * | 8/2004 | Kamath | 372/50.11 |

OTHER PUBLICATIONS

H. Takaoka, C.-A. Chang, E.E. Mendez, L.L. Chang, and L. Esaki, "GaSb-AlSb-InAs Multi-Heterojunctions", Physics 117B & 118B (1983) 741-743, North-Holland Publishing Company.

H. Kitabayashi, T. Waho, and M. Yamamoto, "Crucial Role of Extremeley Thin AlSB Barrier Layers In INAS/ALSB/INAS Resonant Interband Tunneling Diodes", Extended Abstracts of the International Conference on Solid State Devices and Materials, Japan Society of Applied Physics, Tokyo, Ja. 1997.

(Continued)

*Primary Examiner*—Long Pham
*Assistant Examiner*—Steven H Rao
(74) *Attorney, Agent, or Firm*—Tope-McKay & Assoc.

(57) ABSTRACT

A semiconductor device exhibiting interband tunneling with a first layer with a first conduction band edge with an energy above a first valence band edge, with the difference a first band-gap. A second layer with second conduction band edge with an energy above a second valence band edge, with the difference a second band-gap, and the second layer formed permitting electron carrier tunneling transport. The second layer is between the first and a third layer, with the difference between the third valence band edge and the third conduction band edge a third band-gap. A Fermi level is nearer the first conduction band edge than the first valence band edge. The second valence band edge is beneath the first conduction band edge. The second conduction band edge is above the third valence band edge. The Fermi level is nearer the third valence band edge than to the third conduction band edge.

10 Claims, 8 Drawing Sheets

OTHER PUBLICATIONS

R. Beresford, L.F. Luo, K.F. Longenbach, and W.I. Wang, "Interband Tunneling in Single-Barrier INAS/AISB/GASB Heterostructures", Applied Physics Letters, US, American Institute of Physics, New York, vol. 56, No. 10, Mar. 5, 1990, pp. 952-954.

G. Ru and A. Li, "Proposal of Interband Tunneling Structures with Strained Layers", Journal of Applied Physics, US, American Institute of Physics, New York, vol. 76, No. 6, Sep. 15, 1994, pp. 3620-3622.

S. Tehrani, J. Shen, and H. Goronkin, "Three Terminal Quantum Structure Based on Resonant Interband Tunneling", Proceedings of the IEEE/Cornell Conference on Advanced Concepts in High Speed Semiconductor Devices and Circuits, US, New York, IEEE, Aug. 7, 1995, pp. 460-464.

J.N. Schulman, D.H. Chow, and T.C. Hasenberg, "INAS/Antimonide-Based Resonant Tunneling Structures with Ternary Alloy Layers", Solid State Electronics, GB, Elsevier Science Publishers, Barking, vol. 37, No. 4/06, Apr. 1, 1994, p. 981-985.

L.F. Luo, R. Beresford, and W.I. Wang, "Interband Tunneling in Polytype GaSb/AlSb/InAs Heterostructures", Applied Physics Letters, US, American Institute of Physics, New York, vol. 56, No. 10, Mar. 5, 1990, pp. 952-954.

A. Chang, L. Esaki, and E.E. Mendez, "InAs-AlSb-GaSb Tunnel Diode", IBM Technical Disclosure Bulletin, vol. 25, No. 3A Aug. 1982, pp. 1185-1186.

L. Yang, J.F. Chen, and A.Y. Cho, "A new GaSb/AlSb-GaSb/AlSb/InAs double-barrier interband tunneling diode and its tunneling mechanism", J. Appl. Phys. 68(6), Sep. 15, 1990.

R.T. Syme, "Microwave Detection Using GaAs/AlAs Tunnel Structures",GEC Journal of Research, Vo. 11, No. 1, 1993.

B.Su, V.J. Goldman, and J.E. Cunningham, "Single-electron tunneling in nanometer-scale double-barrier heterostructure devices," Physical Review B, vol. 46, No. 12, Sep. 15, 1992.

K. Nomoto, K. Taira, T. Suzuki, I. Hase, H. Hiroshima, and M. Komuro, "Diameter dependence of current-voltage characteristics of ultrasmall area AlSb-InAs resonant tunneling diodes with diameters down to nm," Appl. Phys. Lett. 70(15), Apr. 14, 1997.

T. Schmidt, M. Tewardt, R.J. Haug, K.V. Klitzing, B. Schonherr, P. Grambow, A. Forster, and H. Luth, "Peak-to-valley ratio of small resonant-tunneling diodes with various barrier-thickness asymmetries," Appl. Phys. Lett, 68(6), Feb. 5, 1996.

M. Reddy, M.J. Muller, M.J.W. Rodwell, S.C. Martin, R.E. Muller, R.P. Smith, D.H. Chow, and J.N. Schulman, "Fabrication and dc, microwave characteristics of submicron Schottky-collector AlAs/In0.53GaGa0.47As/InP resonant tunneling diodes," J. Appl. Phys. 77(9), May 1, 1995.

J.R. soderstrom, D.H. Chow, and T.C. McGill, "New negative differential resistance device based on resonant interband tunneling," Appl. Phys. Lett. 55(11), Sep. 11, 1989.

M. Sweeny and J. Xu, "Resonant interband tunnel diodes," Appl. Phys. Lett. 54(6), Feb. 6, 1989.

C.A. Burrus, Jr., "Backward Diodes for Low-Level Millimeter-Wave Detection," IEEE Transactions on Microwave Theory and Techniques, Sep. 1963.

S.M. Sze, "Physics of Semiconductor Devices," 2nd Edition, Bell Laboratories, Incorporated, Murray Hill, New Jersey, John Wiley & Sons.

* cited by examiner

TYPE II INTERBAND HETEROSTRUCTURE BACKWARD DIODES

PRIORITY CLAIM

This application claims the benefit of priority to U.S. patent application Ser. No. 10/970,359, filed on Oct. 20, 2004, and titled "Type II Interband Heterostructure Backward Diodes."

BACKGROUND (1) Technical Field

This invention relates in general to semiconductor devices, and in particular to backward diodes useful in radio frequency detection and mixing.

(2) Description of Related Art

The tunnel diode is a well-known semiconductor device that conventionally includes two regions of heavily doped semiconductor material of opposite conductivity types, separated by a relatively thin junction which permits charge carriers to tunnel through upon the application of a suitable operating potential to the semiconductor regions. The p-doped and n-doped regions of tunnel diodes are so heavily doped that they are degenerate. At equilibrium, a portion of the valence band in the p-doped region of the diode is empty and a portion of the conduction band in the n-doped region is filled.

A slight forward bias brings some levels of the filled portion of the conduction band of the n-doped region into energetic alignment with empty levels of the valence band of the p-doped region. In this situation, quantum-mechanical tunneling allows electrons to flow from the n-doped region to the p-doped region, giving a positive current that first increases with increasing bias. When the filled part of the conduction band of the n-doped region is maximally aligned with the empty part of the valence band of the p-doped region, the current flow is maximized. Subsequently, the current decreases with increasing forward bias, and approaches a minimum value when the filled part of the conduction band of the n-doped region lies opposite the energy gap of the p-doped region. When a yet larger forward bias occurs, electrons and holes are injected over the barrier between the p-doped and n-doped regions, resulting in a rapid increase in current for increasing forward bias. Thus, the current-voltage has a negative differential conductance in the forward region of its characteristic curve.

Use of a heterostructure consisting of adjoining regions of $GaSb_{1-y}As_y$ and $In_{1-x}Ga_xAs$ interfaced with a tunneling junction is described in U.S. Pat. No. 4,198,644 entitled, "Tunnel Diode," issued to Leo Esaki on Apr. 15, 1980 (hereinafter the "Esaki '644 patent"). The heterostructure presented in the Esaki '644 patent includes first and second layers of Group III-V compound semiconductor alloys wherein the first layer is an alloy including a first Group III material and a first Group V material, and the second layer is an alloy including a second Group III material different from the first Group III material and a second Group V material different from the first Group V material, and wherein the valence band of the first alloy is closer to the conduction band of the second alloy than it is to the valence band of the second alloy. The preferred embodiment identified In as the first Group III material, As as the first Group V material, Ga as the second Group III material, and Sb as the second Group V material.

Also, U.S. Pat. No. 4,371,884 entitled, "InAs-GaSb Tunnel Diode," also issued to Leo Esaki (hereinafter the "Esaki '844 patent"), provides for a tunnel diode requiring no heavy doping, and which can be readily fabricated using the process of molecular beam epitaxy. The Esaki '884 patent's tunnel diode heterostructure comprises first and second accumulation regions of relatively lightly-doped group III-V compounds, specifically consisting of $In_{1-x}Ga_xAs$ and $GaSb_{1-y}As_y$, where concentrations expressed in terms of x and y are preferably zero but less than 0.3, and where the improvement consists of an interface of a relatively thin layer of a quaternary compound whose constituent materials are those of the adjoining regions. This interface provides a tunneling junction as opposed to an ohmic junction between contiguous regions of InAs and GaSb.

A need exists in the art to improve current tunneling diodes so that they may be applied to higher bandwidths, with greater dynamic range and greater sensitivity for radio frequency detection. In particular, it is desirable to provide a high degree of non-linearity near zero bias. This is in contrast to the inventions discussed above, which are designed to provide a negative resistance region near zero bias.

SUMMARY OF THE PRESENT INVENTION

In one aspect, the present invention comprises a semiconductor device exhibiting an interband tunneling characteristic. The semiconductor device comprises a first semiconductor layer having a first conduction band edge and a first valence band edge, with the first conduction band edge being an energy level greater than the first valence band edge, with the difference between the first valence band edge and the first conduction band edge being a first band-gap. The device further comprises a second semiconductor layer having a second conduction band edge and a second valence band edge, with the second conduction band edge being an energy level greater than the second valence band edge, with the difference between the second valence band edge and the second conduction band edge being a second band-gap, and the second semiconductor layer formed to allow for electron carrier tunneling transport therethrough. The device also comprises a third semiconductor layer having a third conduction band edge and a third valence band edge; where the second semiconductor layer is between the first semiconductor layer and the third semiconductor layer, with the third conduction band edge being an energy level greater than the third valence band edge, with the difference between the third valence band edge and the third conduction band edge being a third band-gap. The layers presented are further constrained in that: a Fermi level of the semiconductor device is nearer to the first conduction band edge than to the first valence band edge; the (energy level of the) second valence band edge is lower than the first conduction band edge; the second conduction band edge is greater than the third valence band edge; and the Fermi level of the semiconductor device is nearer to the third valence band edge than to the third conduction band edge.

In another aspect, the second semiconductor layer is formed of a set of materials such that the second valence band edge has a varying energy, at least a portion of which increases in a direction from the first semiconductor layer to the third semiconductor layer.

In yet another aspect, the device further comprises a fourth semiconductor layer on the third semiconductor layer, opposite the second semiconductor layer having a fourth conduction band edge and a fourth valence band edge, where the fourth conduction band edge and the fourth valence band edge are below the Fermi level of the semiconductor device.

In still another aspect, the first semiconductor layer is formed of a highly n-doped material; the second semiconductor layer is formed of a nominally undoped material; the third semiconductor layer is formed of a p-doped material; and the fourth semiconductor layer is formed of an n-doped material.

In a further aspect, the first semiconductor layer is n-doped to approximately between $5\times10^{15}$ cm$^{-3}$ and $1\times10^{20}$ cm$^{-3}$.

In a still further aspect, the first semiconductor layer is n-doped to approximately between $1\times10^{17}$ cm$^{-3}$ and $1\times10^{18}$ cm$^{-3}$.

In a yet further aspect, the third semiconductor layer is p-doped to approximately between $1\times10^{16}$ cm$^{-3}$ and $1\times10^{20}$ cm$^{-3}$.

In another aspect, the third semiconductor layer is p-doped to approximately between $10\times10^{18}$ cm$^{-3}$ and $1\times10^{19}$ cm$^{-3}$.

In yet another aspect, the first semiconductor layer consists essentially of InAs.

In still another aspect, the second semiconductor layer consists essentially of $Al_xGa_{1-x}Sb_yAs_{1-y}$, where x is in the range from 0 to 1 and where y is in the range from 0 to 1.

In a further aspect, the values of x and y vary at different locations in the second semiconductor layer.

In a still further aspect, the values of x and y vary from 1 at an interface between the first semiconductor layer and the second semiconductor layer to 0 at an interface between the second semiconductor layer and the third semiconductor layer.

In yet another aspect, the third semiconductor layer consists essentially of a material selected from a group consisting of GaSb, $In_{0.5}Ga_{0.5}Sb$, and InGaSb.

In a further aspect, fourth semiconductor layer is n-doped to approximately between $5\times10^{15}$ cm$^{-3}$ and $1\times10^{20}$ cm$^{-3}$.

Each of the aspects above also correspond to acts in a method for forming a device according to the present invention.

BRIEF DESCRIPTION OF THE DRAWINGS

The objects, features and advantages of the present invention will be apparent from the following detailed descriptions of the preferred aspects of the invention in conjunction with reference to the following drawings, where.

DETAILED DESCRIPTION

The present invention provides improved backward diode structures, which may be tailored to a variety of applications. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

The present invention uses AlSb and AlGaSb layers to control the curvature of the current voltage (I-V) curve and current density through the device, thus decreasing the forward current while allowing the tunneling current in the negative bias direction to be relatively large and unaffected. The desirable characteristic of this design is to provide a highly nonlinear portion of the I-V curve near zero bias, which is greatly improved by the presence of the AlGaSb layers.

Figure 1:
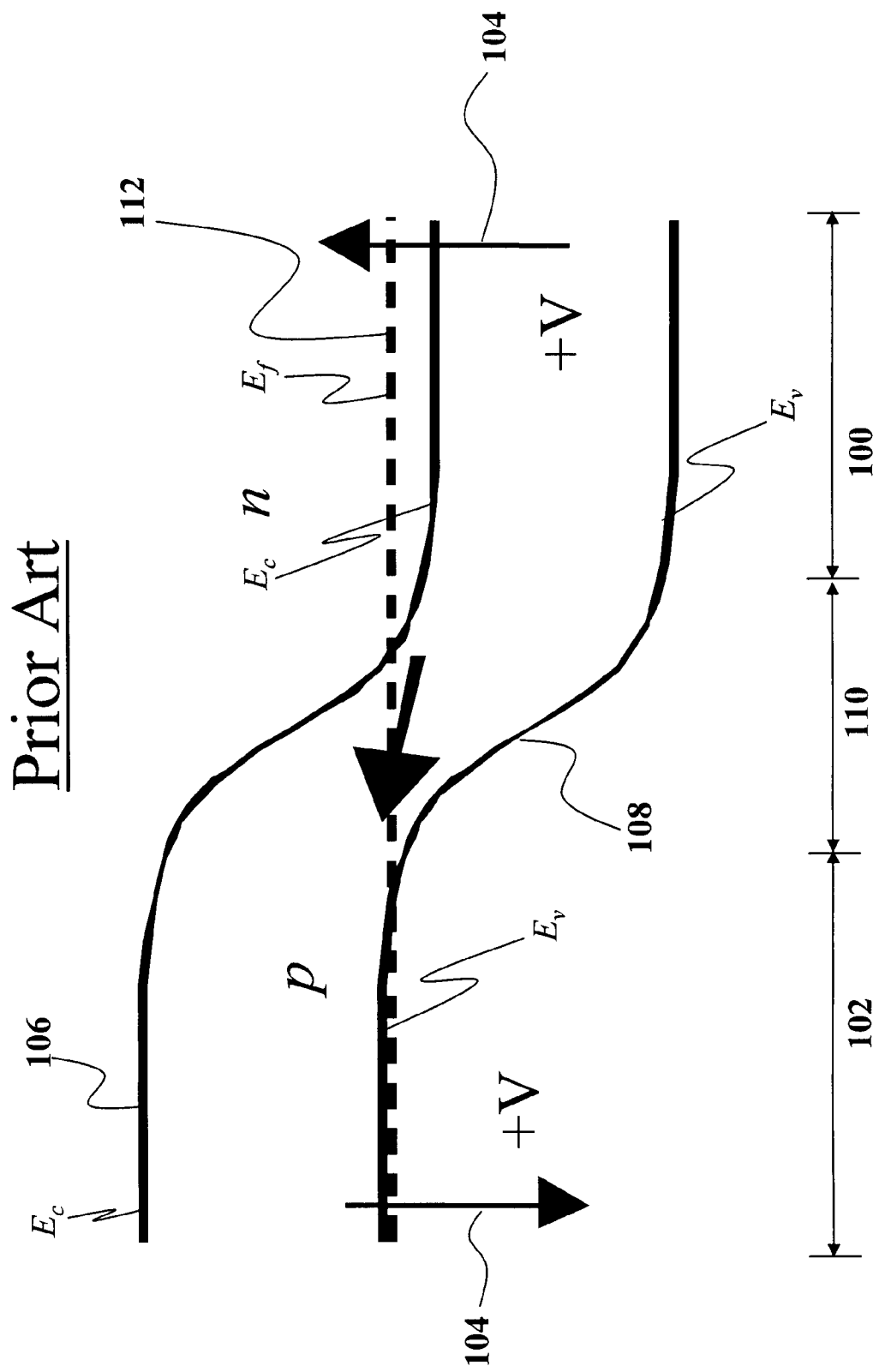
FIG. 1 is a prior art band-edge diagram illustrative of a conventional implementation of a backward or Esaki diode.

In order to provide a frame of reference, FIG. 1 presents a prior art band-edge diagram associated with the conventional heavily doped p-n junction in Ge or another semiconductor. The heavy doping causes the energy bands to bend such that electrons in the n-doped side can tunnel through the relatively thin band-bending region into the p-doped side. If the doping is very heavy on both sides, a negative differential resistance peak in the current-voltage (I-V) curve is produced for positive bias as electrons tunnel from the n-doped side 100 to the holes in the p-doped side 102. Both the n-doped and p-doped layers are typically formed of Ge. The arrows 104 indicate the direction of the shift of the conduction band edge 106 and the valence band edge 108 with positive bias. For sufficient positive bias, the electron energies are too high for tunneling into the hole states, and negative differential resistance results. For negative bias, if the doping is high, the band-bending region 110 is short, and the electrons from the p-doped side 102 at energies below the Fermi level 112 can tunnel (from left to right) into the n-doped side 100 above the Fermi level 112.

Figure 2:
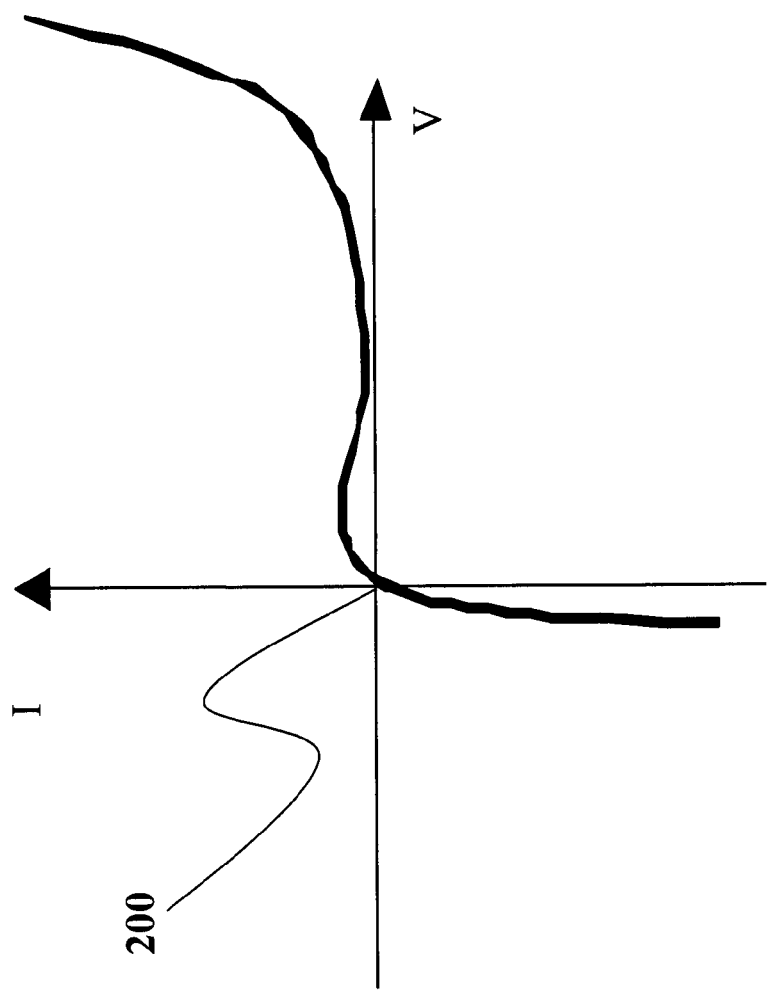
FIG. 2 is a prior art qualitative example of a current-voltage characteristic diagram typically exhibited by the backward diode version of the Esaki diode.

The resulting current can be large, and increases exponentially with reverse bias. If the doping of the p-doped side 102 is DIODES not too large, the Fermi level 112 will be close to the valence band edge 108 on the p-doped side 102. In this state, there will not be many hole states for the electrons to tunnel into with forward bias. The peak current of the negative resistance current-voltage curve will be small, while the tunneling current in the negative bias direction is relatively unaffected and large, as shown in FIG. 2. This is the backward diode version of the Esaki diode. The desirable characteristic is the highly nonlinear current-voltage curve characteristic near zero bias 200, which makes the device useful for mixing and detecting radio frequency signals.

Figure 3:
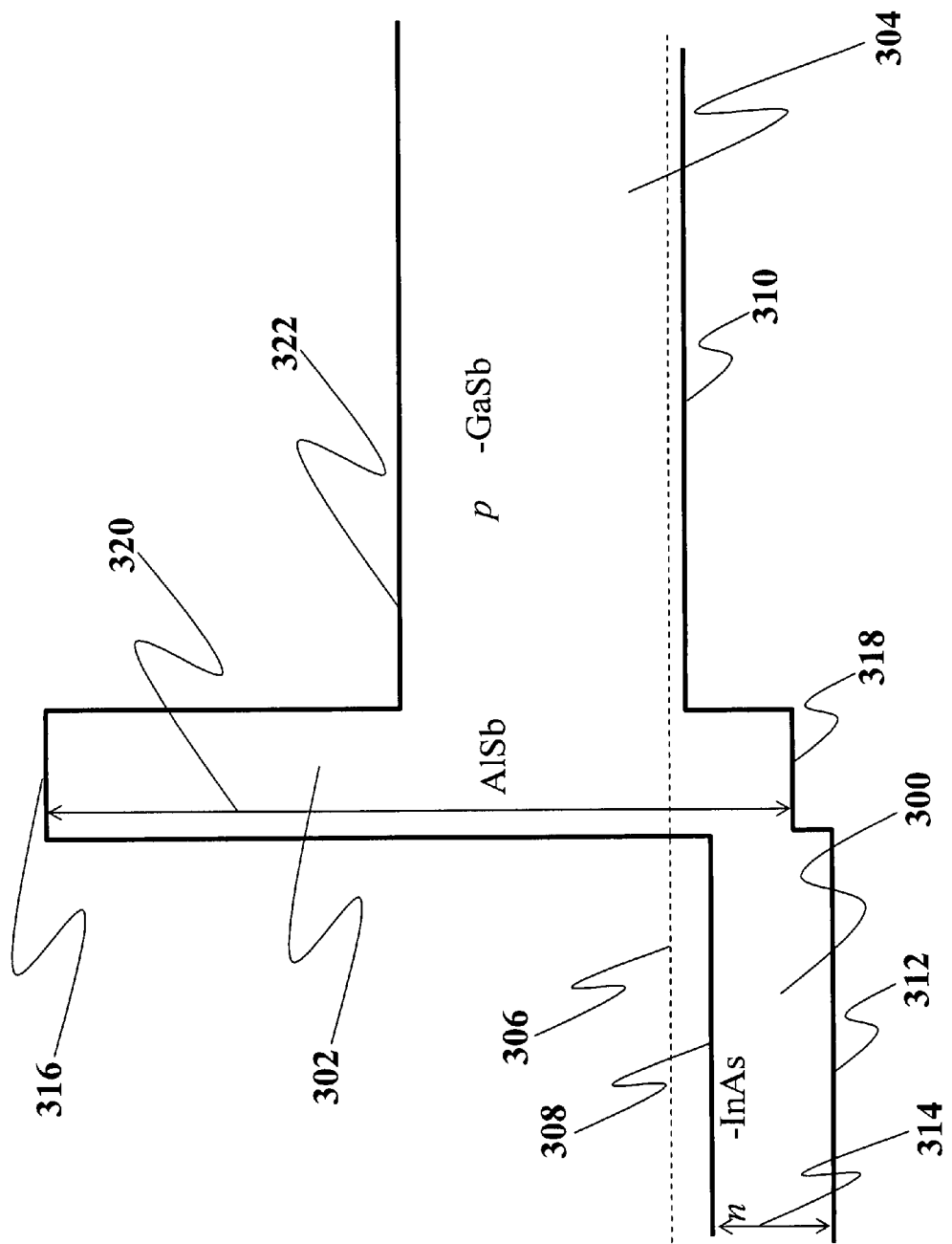
FIG. 3 is a band-edge diagram illustrative of the InAs/AlSb/GaSb heterostructure backward diode system of an embodiment of the present invention.

The present invention achieves improved behavior using an InAs/AlSb/GaSb heterostructure system, an example band-edge diagram for which is depicted in FIG. 3. Generally, the device shown in FIG. 3 includes a first semiconductor layer 300 (e.g., an n-type layer), a second semiconductor layer 302 (e.g., a tunneling barrier layer), and a third semiconductor layer 304 (e.g., a p-type layer). It is noteworthy that each of these layers is a region that may comprise any number of material layers. The use of AlSb for the second semiconductor layer 302 provides greater design flexibility than the exclusive use of InAs and GaSb in the first semiconductor layer 300 and the third semiconductor layer 304, respectively. The width of the second semiconductor layer 302 can be designed to provide tailorable tunneling between the first semiconductor layer 300 and the third semiconductor layer 304. The use of an InAs/AlSb/GaSb heterostructure is in contrast with the InAs/GaSb heterostructure, which has a unique tunneling condition. For purposes of illustration simplicity, no band-bending is demonstrated such as that shown in FIG. 1, although it will generally be present in actual application. The Fermi level 306 is above the edge of the third semiconductor layer 304 (GaSb) valence band edge 310 in the region of the third (p-doped GaSb) semiconductor layer 304. The electron transport for forward-bias (left-to-right in the figure) is desirably small due to the lack of holes in the p-doped GaSb third semiconductor layer 304 to tunnel into. However, the electron transport for backward bias (right-to-left in the figure) will also be small for small bias because of the small density of holes in the GaSb side for carrying the current.

If the Fermi level is between the first conduction band edge 308 of the first (InAs) semiconductor layer 300 and the third (GaSb) valence band edge 310, the forward and backward currents are approximately proportional to the bias voltage over a range, and thus the non-linearity is small.

In sum, the essential features of the device of FIG. 3 are that it comprises a first semiconductor layer 300 having a first conduction band edge 308 and a first valence band edge 312. The first conduction band edge 308 is an energy level greater than the first valence band edge 312. The difference between the first valence band edge 312 and the first conduction band edge 308 is a first band-gap 314. The device further comprises a second semiconductor layer 302 having a second conduction band edge 316 and a second valence band edge 318, with the second conduction band edge 316 being an energy level greater than the second valence band edge 318. The difference between the second valence band edge 318 and the second conduction band edge 316 is a second band-gap 320. The second semiconductor layer 302 is formed to allow for electron carrier tunneling transport therethrough. The device further comprises a third semiconductor layer 304 having a third conduction band edge 322 and a third valence band edge 310. The second semiconductor layer 302 is between the first semiconductor layer 300 and the third semiconductor layer 304, with the third conduction band edge 322 being an energy level greater than the third valence band edge 310. The difference between the third valence band edge 310 and the third conduction band edge 322 is a third band-gap. Further, the Fermi level 306 of the semiconductor device is nearer to the first conduction band edge 308 than to the first valence band edge 312. Additionally, the second valence band edge 318 is lower (in energy) than the first conduction band edge 308. Also, the second conduction band edge 316 is greater than the third valence band edge 310. The Fermi level 306 of the semiconductor device is nearer to the third valence band edge 310 than to the third conduction band edge 322.

The first semiconductor layer 300 is typically formed of a highly n-doped material, typically n-doped to approximately between $5 \times 10^{15}$ cm$^{-3}$ and $1 \times 10^{20}$ cm$^{-3}$. More desirably, the first semiconductor layer 300 is formed of a material consisting essentially of InAs, n-doped to approximately between $1 \times 10^{17}$ cm$^{-3}$ and $1 \times 10^{18}$ cm$^{-3}$. The second semiconductor layer 302 is typically formed of a nominally-doped (undoped) material. Greater detail regarding the composition of the second semiconductor layer 302 will be presented generally with regard to FIG. 8, below. The third semiconductor layer 304 is typically formed of a p-doped material, p-doped to approximately between $1 \times 10^{16}$ cm$^{-3}$ and $1 \times 10^{20}$ cm$^{-3}$. More desirably, the third semiconductor layer is p-doped to approximately between $1 \times 10^{18}$ cm$^{-3}$ and $1 \times 10^{19}$ cm$^{-3}$. As an example, the third semiconductor layer 304 may be formed of a material consisting essentially of a material selected from a group consisting of GaSb, In$_{0.5}$Ga$_{0.5}$Sb, and InGaSb.

Figure 4:
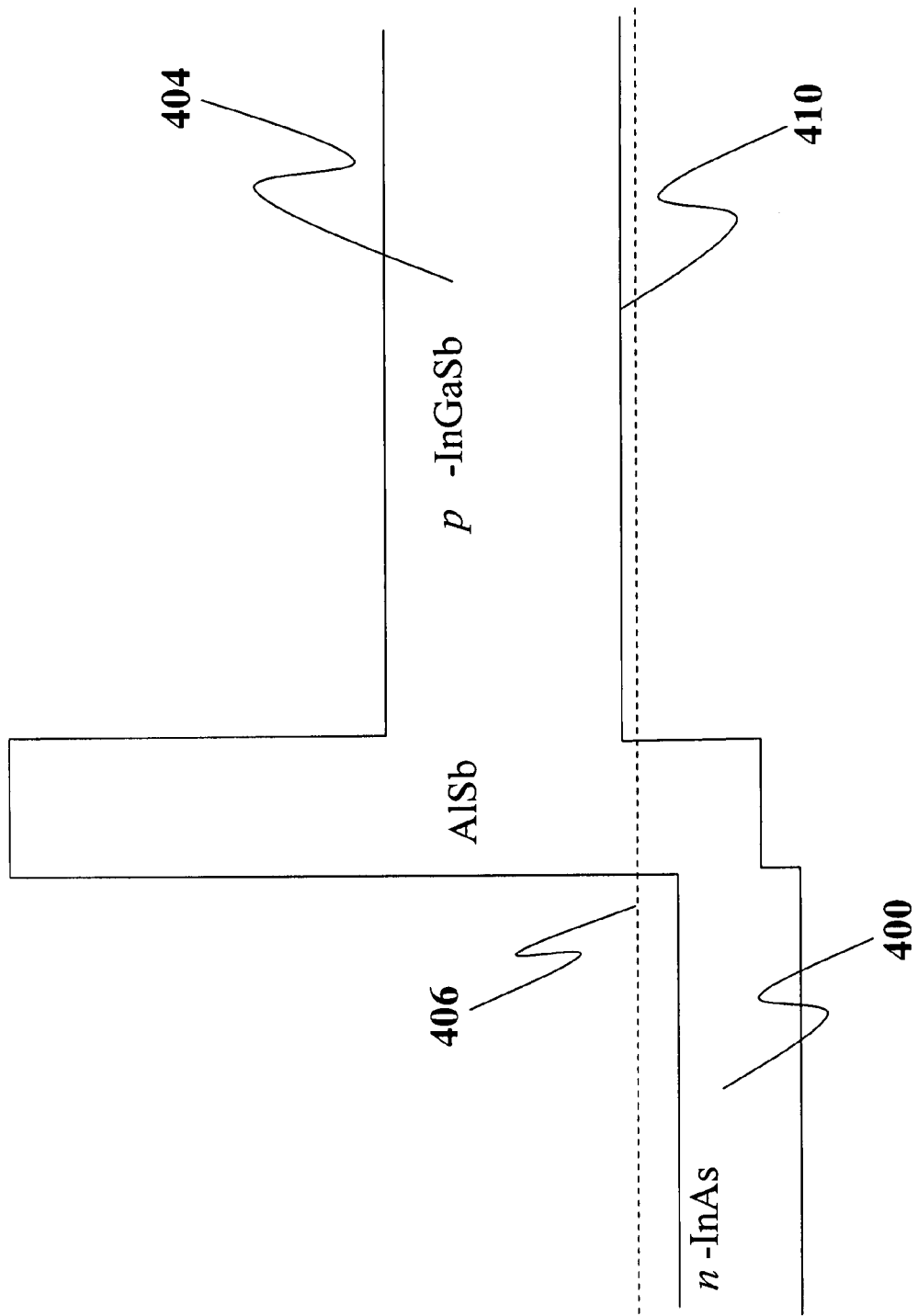
FIG. 4 is a band-edge diagram illustrative of a variation of the embodiment of the present invention shown in FIG. 3, wherein InGaSb is substituted for GaSb.

A band-edge diagram of a variation of the embodiment of FIG. 3 is shown in FIG. 4, where InGaSb is substituted for GaSb. The edge of the InGaSb third valence band edge 410 is raised by a small amount relative to that of the (GaSb) third valence band edge 310 shown in FIG. 3, allowing electrons at the top of the InGaSb third valence band edge 410 access to the energy range above the Fermi level 406 in the first (InAs) semiconductor layer 400 when the device is negatively biased. The Fermi level 406 in the InGaSb third semiconductor layer 404 is desirably tailored close to the InGaSb third valence band edge 410 to minimize forward current. Still, in some cases, the density of holes in the InGaSb side may be too small to allow for sufficient backward current.

Figure 5:
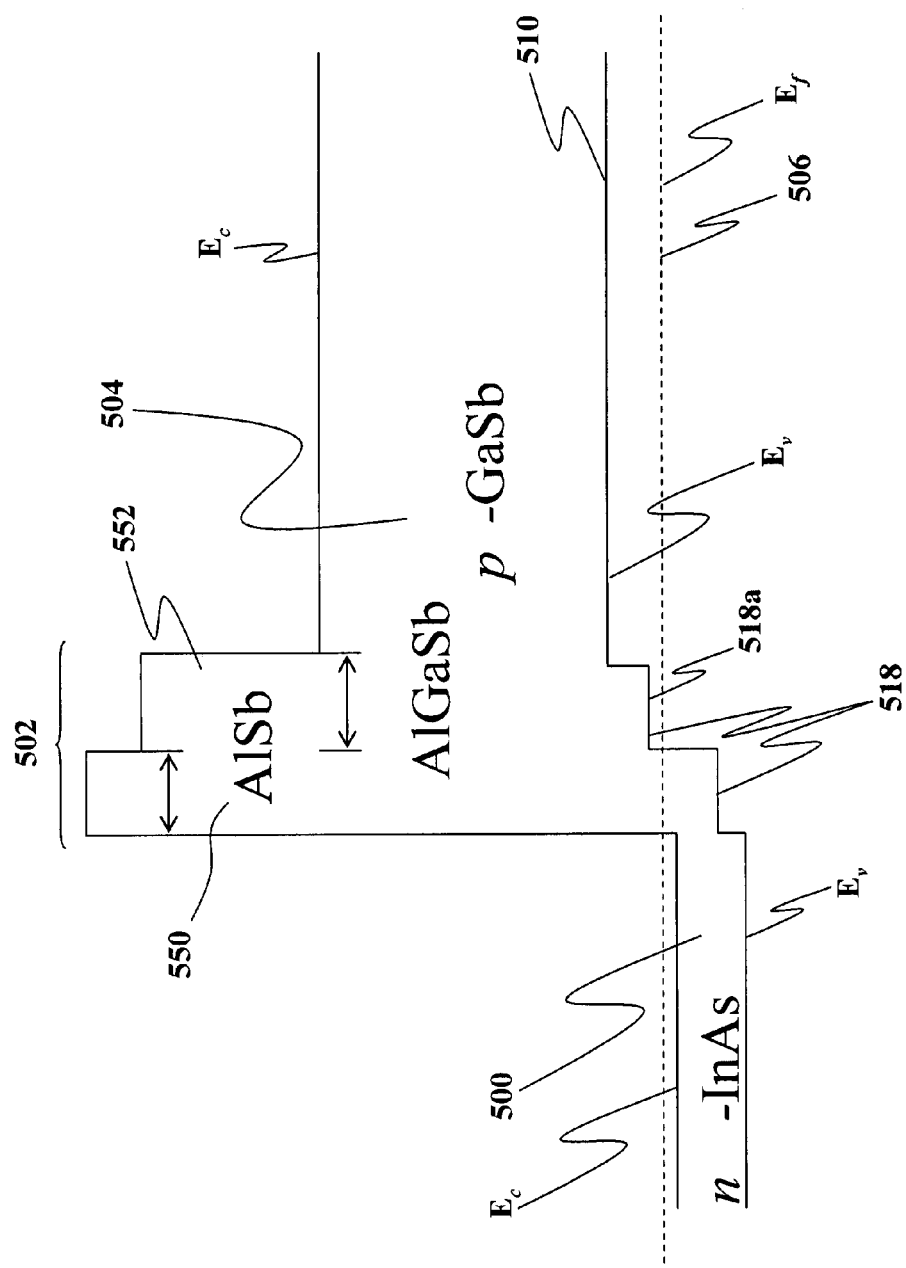
FIG. 5 is a band-edge diagram illustrative of another variation of the embodiment of the present invention shown in FIG. 3, wherein two types of barriers are present, namely AlSb and AlGaSb.
Figure 6:
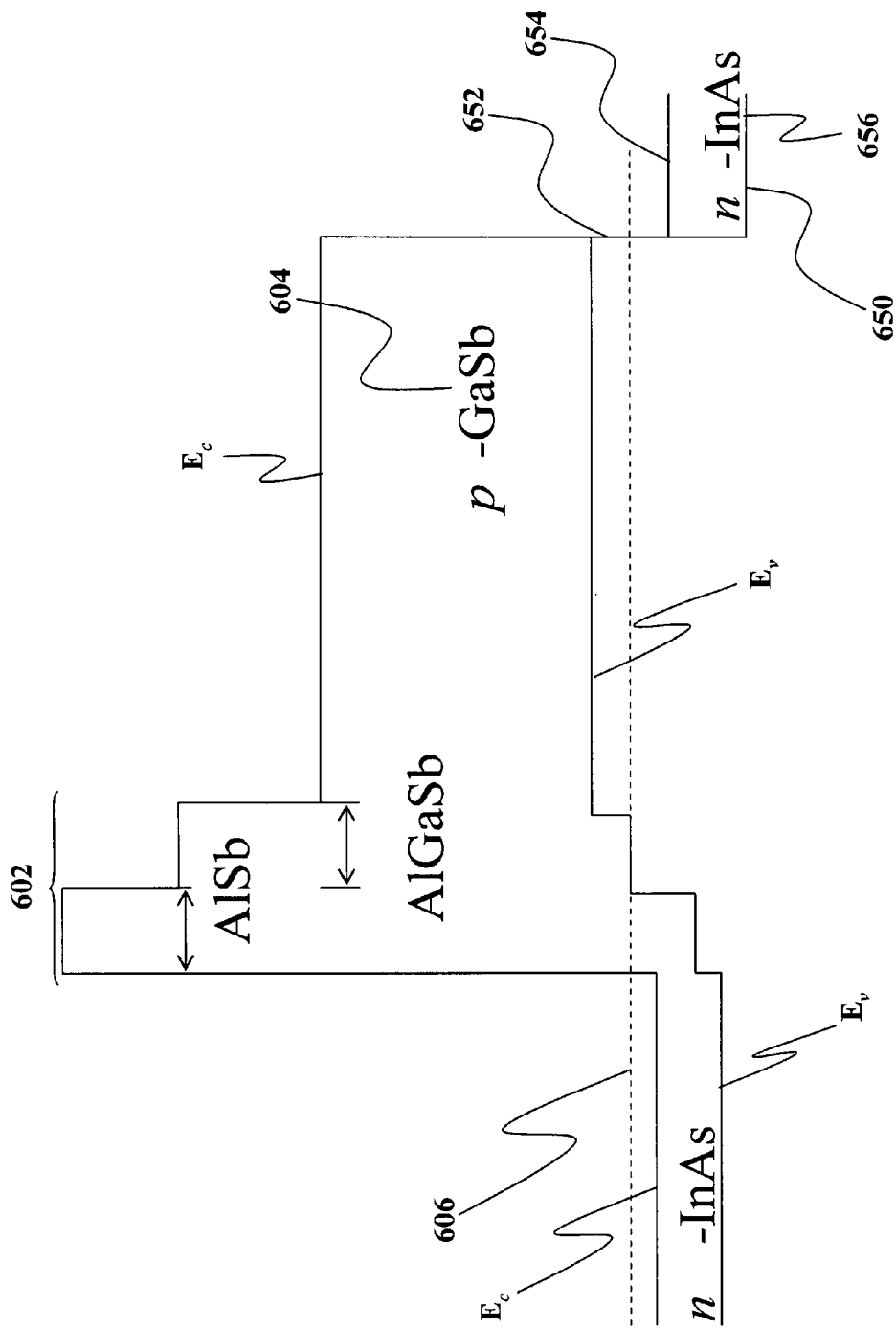
FIG. 6 is a band-edge diagram of an embodiment of the present invention similar to that shown in FIG. 5, with an additional n-type InAs layer formed on the p-type GaSb layer on the right-hand side of the FIG. 5.

In FIG. 5 and FIG. 6, two further modifications are depicted. The second semiconductor layer 502, shown in FIG. 5, includes two types of barriers, AlSb 550 and AlGaSb 552. The addition of Ga, to provide AlGaSb, decreases the barrier band gap and the valence band discontinuity with GaSb. The thickness of the AlSb barrier 550 is adjustable to control the overall current due to tunneling, while the AlGaSb barrier 552 contributes additional blocking to the forward current, i.e., electrons tunneling from the InAs first semiconductor layer 500 through to the GaSb third semiconductor layer 504. However, the AlGaSb barrier 552 does not significantly block the (beneficial) backward tunneling of electrons from the first part 518a of the valence band edge 518 of the second semiconductor layer 502 at the AlGaSb barrier 552, as the electrons are "underneath" the AlGaSb barrier 552 and can flow into available states above the Fermi level 506 in the InAs first semiconductor layer 500. As the Fermi level 506 can now be significantly below the GaSb third valence band edge 510, there will be sufficient holes to carry the backward current.

In FIG. 6 an additional fourth semiconductor layer 650 (i.e., supplemental semiconductor layer) is depicted as an n-type InAs cladding layer placed on the p-type GaSb third semiconductor layer 604 on the right. There is no barrier at the right side interface 652, thus providing a convenient transition back to an InAs n-type contact on the right. The fourth semiconductor layer 650 is placed on the third semiconductor layer 604 opposite the second semiconductor layer 602 (i.e., tunneling layer). The fourth semiconductor layer 650 has a fourth conduction band edge 654 and a fourth valence band edge 656. It is desirable that the fourth conduction band edge 654 and the fourth valence band edge 656 both be below the Fermi level 606 of the semiconductor device. The fourth semiconductor layer 650 is typically formed of an n-doped material, n-doped to approximately between $5 \times 10^{15}$ cm$^{-3}$ and $1 \times 10^{20}$ cm$^{-3}$.

Figure 7:
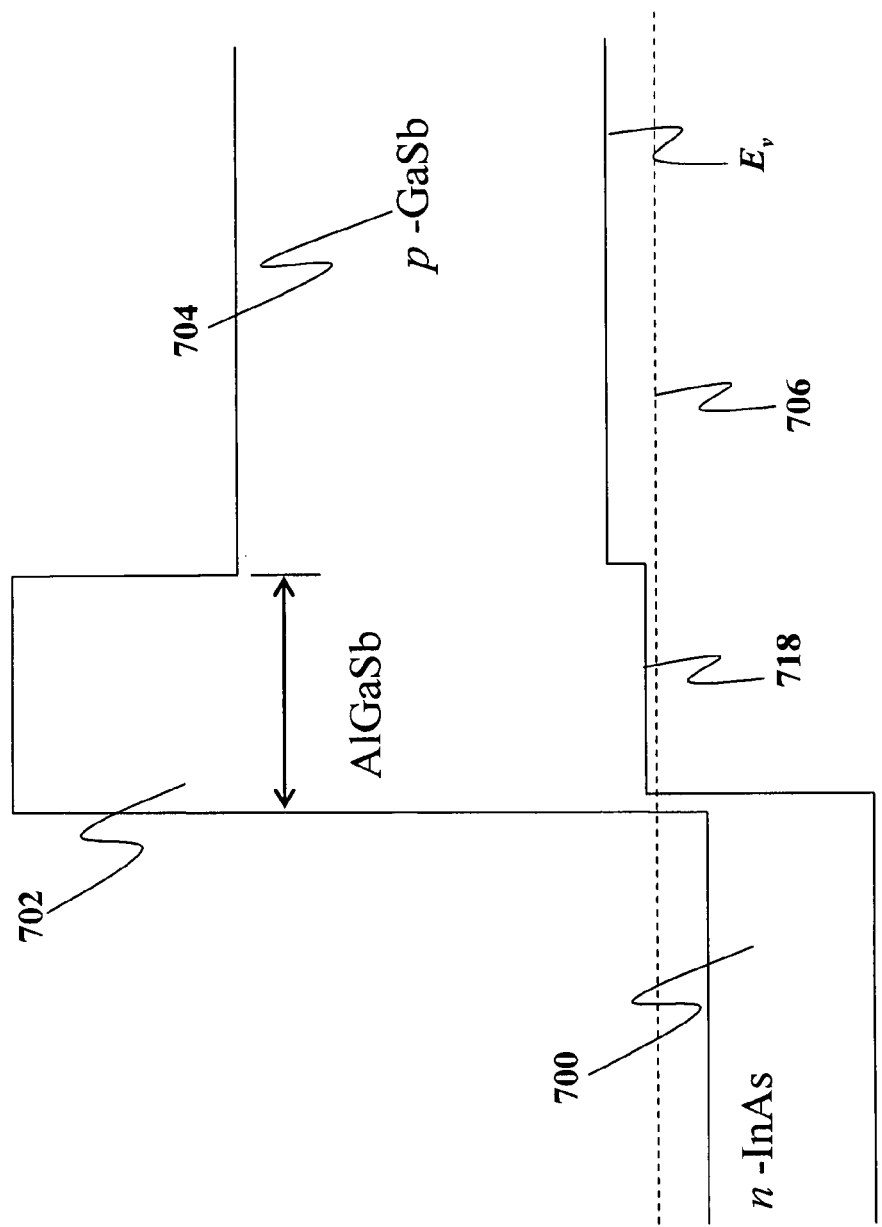
FIG. 7 is a band-edge diagram illustrative of another variation of the embodiment of the present invention shown in FIG. 3, wherein a single AlGaSb barrier with an adjustable valence band is present.
Figure 8:
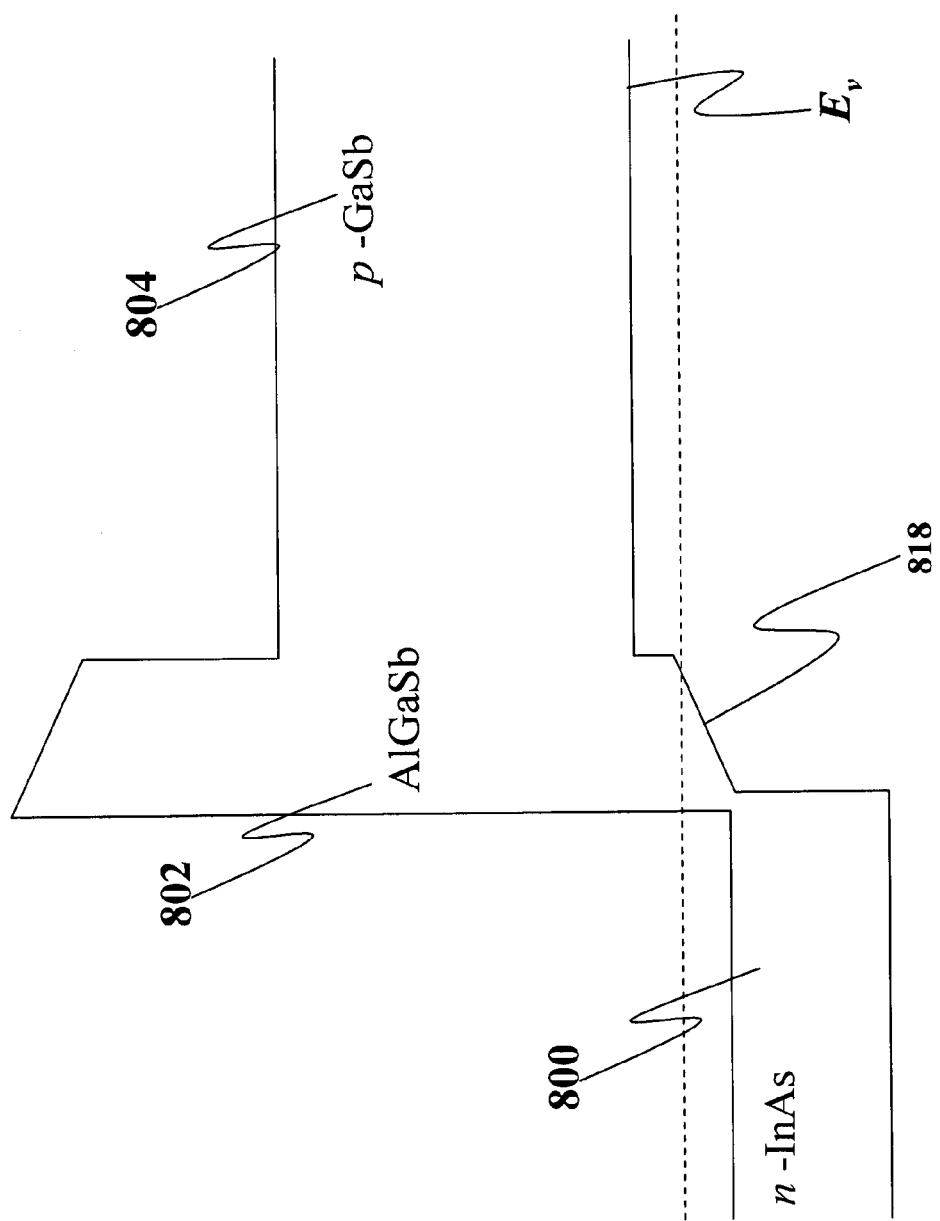
FIG. 8 is a band-edge diagram illustrative of another variation of the embodiment of the present invention shown in FIG. 5, depicting the use of a variably-graded barrier.

FIGS. 7 and 8 depict two additional devices according to the present invention. FIG. 7 demonstrates a single AlGaSb barrier used as the second semiconductor layer 702 with an adjustable second valence band edge 718. The second valence band edge 718 (of the AlGaSb barrier) is close to the Fermi level 706. The presence of this barrier blocks electrons from the InAs first semiconductor layer 700 from tunneling through the large valence band barrier before reaching the GaSb third semiconductor layer 704 with forward bias. This variation can trade off higher currents for lower nonlinearity since it lacks the AlSb barrier present in the embodiments shown in FIGS. 5 and 6.

FIG. 8 depicts another device according to the present invention with a variably-graded AlGaSb barrier layer used as the second semiconductor layer 802, combining a higher Al concentration in the AlGaSb second semiconductor layer 802 near the interface with the InAs first semiconductor layer 800 and a lower Al concentration in the AlGaSb second semiconductor layer 802 near the interface with the GaSb third semiconductor layer 804. This condition will produce an enhanced nonlinear increase in the backward current with negative bias, as the width of the effective triangular barrier that the valence band electrons must tunnel through decreases with bias. Thus, in this aspect, the device is formed of a set of materials such that the second valence band edge 818 has a varying energy. In general, the second valence band edge 818 need not be linearly-varying nor need it always vary along its length. Rather, the only desirable constraint is that at least a portion of the second valence band edge 818 increases in a direction from the first semiconductor layer 800 to the third semiconductor layer 804.

In order to achieve the band edge diagram shown in FIG. 8, the second semiconductor layer 802 may, for example, consist essentially of $Al_xGa_{1-x}Sb_yAs_{1-y}$, where x is in the range from 0 to 1 and where y is in the range from 0 to 1. In general, to achieve the "grading" effect, the values of x and y vary at different locations in the second semiconductor layer 802. The variation in x and y may be any function, in order to provide the desired shape of the second valence band edge 818. In one case, the values of x and y may vary from 1 at an interface between the first semiconductor layer 800 and the second semiconductor layer 802 to 0 at an interface between the second semiconductor layer 802 and the third semiconductor layer 804.

In another aspect of the present invention, the semiconductor comprises an n-type layer having a conduction band edge, a tunneling barrier layer having a band gap is disposed on the n-type layer. A p-type layer having a valence band edge is disposed on the tunneling barrier layer. When no bias voltage is applied, the Fermi level of the device is close in energy to the conduction band edge of the n-type layer and the valence band edge of the p-type layer, where the Fermi level lays in the band gap.

Additionally, the tunneling barrier layer has a valence band edge formed of a set of materials such that the valence band edge of the tunneling barrier layer has a varying energy, at least a portion of which increases in a direction from the n-type layer to the p-type layer. A supplemental semiconductor layer is disposed on the p-type layer, opposite the tunneling barrier layer, having a conduction band edge and a valence band edge. The conduction band edge of the supplemental semiconductor layer and the valence band edge of the supplemental semiconductor layer are below the Fermi level of the semiconductor device.

The layers can be formed of a variety of materials, non-limiting examples of which include the n-type layer being formed of a highly n-doped material; the tunneling barrier layer being formed of a nominally undoped material; the p-type layer being formed of a p-doped material; and the supplemental semiconductor layer being formed of an n-doped material. For example, the n-type layer consists essentially of InAs, whereas the tunneling barrier layer consists essentially of $Al_xGa_{1-x}Sb_yAs_{1-y}$, where x is in the range from 0 to 1 and where y is in the range from 0 to 1. The values of x and y vary at different locations in the tunneling barrier layer, with the value of x varies from 1 at an interface between the n-type layer and the tunneling barrier layer to 0 at an interface between the tunneling barrier layer and the p-type layer.

As an additional example; the p-type layer consists essentially of $In_xGa_{1-x}Sb$. Furthermore, the n-type layer is formed of n doped InAs, the tunneling barrier layer is formed of AlSb, and the p-type layer is formed of GaSb, and the AlGaSb layer is formed between the tunneling barrier layer and the p-type layer. The supplemental layer of n+ doped InAs formed on the p-type layer opposite the AlGaSb layer.

The layers may be doped to receive the desired effect. For example, the n-type layer is n-doped to approximately between $5 \times 10^{15}$ cm$^{-3}$ and $1 \times 10^{20}$ cm$^{-3}$. More particularly, the n-type layer is n-doped to approximately between $1 \times 10^{16}$ cm$^{-3}$ and $1 \times 10^{19}$ cm$^{-3}$. Regarding the p-type layer, the p-type layer is p-doped to approximately between $1 \times 10^{16}$ cm$^{-3}$ and $1 \times 10^{20}$ cm$^{-3}$. With more specificity, the p-type layer is p-doped to approximately between $1 \times 10^{18}$ cm$^{-3}$ and $1 \times 10^{19}$ cm$^{-3}$. Furthermore, the supplemental semiconductor layer is n-doped to approximately between $5 \times 10^{15}$ cm$^{-3}$ and $1 \times 10^{20}$ cm$^{-3}$.

Although the present invention has been described as a set of layers forming a device, the invention also includes the method of forming a device through acts of forming layers on a substrate. It will be appreciated by one of skill in the art that standard fabrication processes can be used in the acts of the method of the present invention in order to form a device according to the present invention. Additionally, although several specific material families have been presented, many other materials may be used without departing from the scope of the present invention. It will be further appreciated by one of skill in the art that the number of possible material combinations is very large, and that the band-edge constraints taught herein may be achieved through many material combinations without departing from the scope of the present invention.

What is claimed is:

1. A semiconductor device exhibiting an interband tunneling characteristic, the semiconductor device comprising:
    an n-type layer having a conduction band edge;
    a tunneling barrier layer having a bandgap, the tunneling barrier layer disposed on the n-type layer; and
    a p-type layer having a valence band edge, the p-type layer disposed on the tunneling barrier layer; and where a Fermi level of the device, when no bias voltage is applied, is close in energy to the conduction band edge of the n-type layer and the valence band edge of the p-type layer; and where the Fermi level lies in the bandgap of the tunneling barrier layer;

wherein the n-type layer comprises n doped InAs, the tunneling barrier layer comprises AlSb, and the p-type layer comprises GaSb, and wherein a AlGaSb layer is formed between the tunneling barrier layer and the p-type layer.

2. A semiconductor device as set forth in claim 1, wherein the tunneling barrier layer has a valence band edge and where the tunneling barrier layer is formed of a set of materials such that the valence band edge of the tunneling barrier layer has a varying energy, at least a portion of which increases in a direction from the n-type layer to the p-type layer.

3. A semiconductor device as set forth in claim 2, further comprising a supplemental semiconductor layer on the p-type layer, opposite the tunneling barrier layer, having a conduction band edge and a valence band edge, where the conduction band edge of the supplemental semiconductor layer and the valence band edge of the supplemental semiconductor layer are below the Fermi level of the semiconductor device.

4. A semiconductor device as set forth in claim 1, further comprising a supplemental layer of n+ doped InAs formed on the p-type layer opposite the AlGaSb layer.

5. A semiconductor device as set forth in claim 1, further comprising a supplemental semiconductor layer on the p-type layer, opposite the tunneling barrier layer, having a conduction band edge and a valence band edge, where the conduction band edge of the supplemental semiconductor layer and the valence band edge of the supplemental semiconductor layer are below the Fermi level of the semiconductor device.

6. A semiconductor device as set forth in claim 1, where the p-type layer consists essentially of $In_xGa_{1-x}Sb$.

7. A semiconductor device as set forth in claim 5, wherein the supplemental semiconductor layer is n-doped to approximately between $5\times10^{15}$ cm$^{-3}$ and $1\times10^{20}$ cm$^{-3}$.

8. A semiconductor device exhibiting an interband tunneling characteristic, the semiconductor device comprising:
   an n-type layer having a conduction band edge;
   a tunneling barrier layer having a band gap, the tunneling barrier layer disposed on the n-type layer; and a p-type layer having a valence band edge, the p-type layer disposed on the tunneling barrier layer; and where a Fermi level of the device, when no bias voltage is applied, is close in energy to the conduction band edge of the n-type layer and the valence band edge of the p-type layer; and where the Fermi level lies in the band gap of the tunneling barrier layer;
   wherein the tunneling barrier layer comprises $Al_xGa1.xSbyAS1.y$, where x is in the range from 0 to 1 and where y is in the range from 0 to 1, wherein the tunneling barrier layer is formed between the n-type layer and the p-type layer.

9. A semiconductor device as set forth in claim 8, where the values of x and y vary at different locations in the tunneling barrier layer.

10. A semiconductor device as set forth in claim 9, where the value of x varies from 1 at an interface between the n-type layer and the tunneling barrier layer to 0 at an interface between the tunneling barrier layer and the p-type layer.

* * * * *